United States Patent [19]

Juengling et al.

[11] Patent Number: 5,756,390
[45] Date of Patent: May 26, 1998

[54] MODIFIED LOCOS PROCESS FOR SUB-HALF-MICRON TECHNOLOGY

[75] Inventors: Werner Juengling; Viju K. Mathews, both of Boise, Id.

[73] Assignee: Micron Technology, Inc., Boise, Id.

[21] Appl. No.: 607,801

[22] Filed: Feb. 27, 1996

[51] Int. Cl.[6] .................................................. H01L 21/76
[52] U.S. Cl. ................................................ 438/439; 438/693
[58] Field of Search ................................ 437/69, 70, 72, 437/228 POL, 228 PL; 156/636.1; 148/DIG. 85, DIG. 86, DIG. 117; 438/439, 229, 230, 692, 693

[56] References Cited

U.S. PATENT DOCUMENTS

| | | |
|---|---|---|
| 4,630,356 | 12/1986 | Christie et al. . |
| 5,094,712 | 3/1992 | Becker et al. . |
| 5,139,967 | 8/1992 | Sandhu et al. . |
| 5,169,491 | 12/1992 | Doan . |
| 5,229,331 | 7/1993 | Doan et al. . |
| 5,286,344 | 2/1994 | Blalock et al. . |
| 5,300,463 | 4/1994 | Cathey et al. . |
| 5,302,233 | 4/1994 | Kim et al. . |
| 5,338,750 | 8/1994 | Tuan et al. . |
| 5,344,525 | 9/1994 | Cathey . |
| 5,358,892 | 10/1994 | Rolfson . |
| 5,358,894 | 10/1994 | Fazan et al. . |
| 5,372,973 | 12/1994 | Doan et al. . |
| 5,413,953 | 5/1995 | Chien et al. .................. 437/69 |
| 5,560,802 | 10/1996 | Chisholm ......................... 437/69 |
| 5,567,645 | 10/1996 | Ahn et al. . |

FOREIGN PATENT DOCUMENTS

| | | |
|---|---|---|
| 2-260639 | 10/1990 | Japan . |
| 3-104224 | 7/1991 | Japan . |
| 3-266435 | 11/1991 | Japan . |
| 4-72729 | 3/1992 | Japan . |
| 4-209534 | 7/1992 | Japan . |

OTHER PUBLICATIONS

Landis, H., et al. "Integration of Chemical Mechanical ... Manufacturing", Thin Solid Films, 220(1992), pp. 1–7.
B. Davavi et al., "A New Planarization Technique Using a Combination of RIE and Chemical Mechanical Polish (CMP), " Tech. Dig. IEDM 1989, pp. 61–64.

(List continued on next page.)

*Primary Examiner*—George R. Fourson
*Attorney, Agent, or Firm*—Knobbe, Martens, Olson & Bear, LLP

[57] ABSTRACT

A process for producing a wafer comprising depositing a pad oxide layer, depositing a silicon nitride layer, patterning and etching the silicon nitride to expose the wafer and define masking stacks, forming field oxide isolation regions in the exposed regions and then removing the masking stack in such a way that reduction in the thickness of the field isolation regions are minimized. In particular, in one implementation, the cap oxide on the top of the masking stack is removed through chemical mechanical polishing (CMP). In another implementation, a sacrificial passivation layer, such as silicon dioxide or polysilicon, is deposited over the field isolation regions and the masking stacks. The sacrificial passivation layer and the cap oxide on the upper surface of the masking stacks are then removed through either CMP or selective etching. With the passivation layer, the field isolation regions are protected against diminishment during subsequent etching of the cap oxide which permits the field isolation region to be initially grown to their desired thickness. This results is less bird's beak encroachment and problems associated therewith as the field isolation regions need not be as thick initially. The sacrificial passivation layer can then be removed, subsequent to removal of the masking stack by growing a sacrificial layer which either absorbs the passivation layer, or does not significantly increase its thickness, and then etching the sacrificial layer to expose the underlying wafer and isolation regions.

44 Claims, 9 Drawing Sheets

OTHER PUBLICATIONS

J. W. Lutze et al., "Field Oxide Thinning in Poly Buffer LOCOS Isolation with Active Area Spacings to 0.1 µm," J. Electrochemical Soc., Jun. 1990, pp. 1867–1870.

S. Sze, "VLSI Technology," 2nd Ed., McGraw Hill Co., New York, pp. 38–44(date unknown).

S. Sze, "VLSI Technology," 2nd Ed., McGraw Hill Co., New York, pp. 241–244, 249–255, 258–260 (date unknown).

S. Wolf, "Silicon Processing for the VLSI Era," vol. 1, Lattice Press, Sunset Beach, CA, pp. 539–542, 555–557, 564–565, 1986.

S. Wolf, "Silicon Processing for the VLSI Era," vol. 2, Lattice Press, Sunset Beach, CA, pp. 23–33, 220–229, 237–239, 1990.

S. Wolf, "Silicon Processing for the VLSI Era," vol. 3, Lattice Press, Sunset Beach, CA, pp. 330–342, 1994.

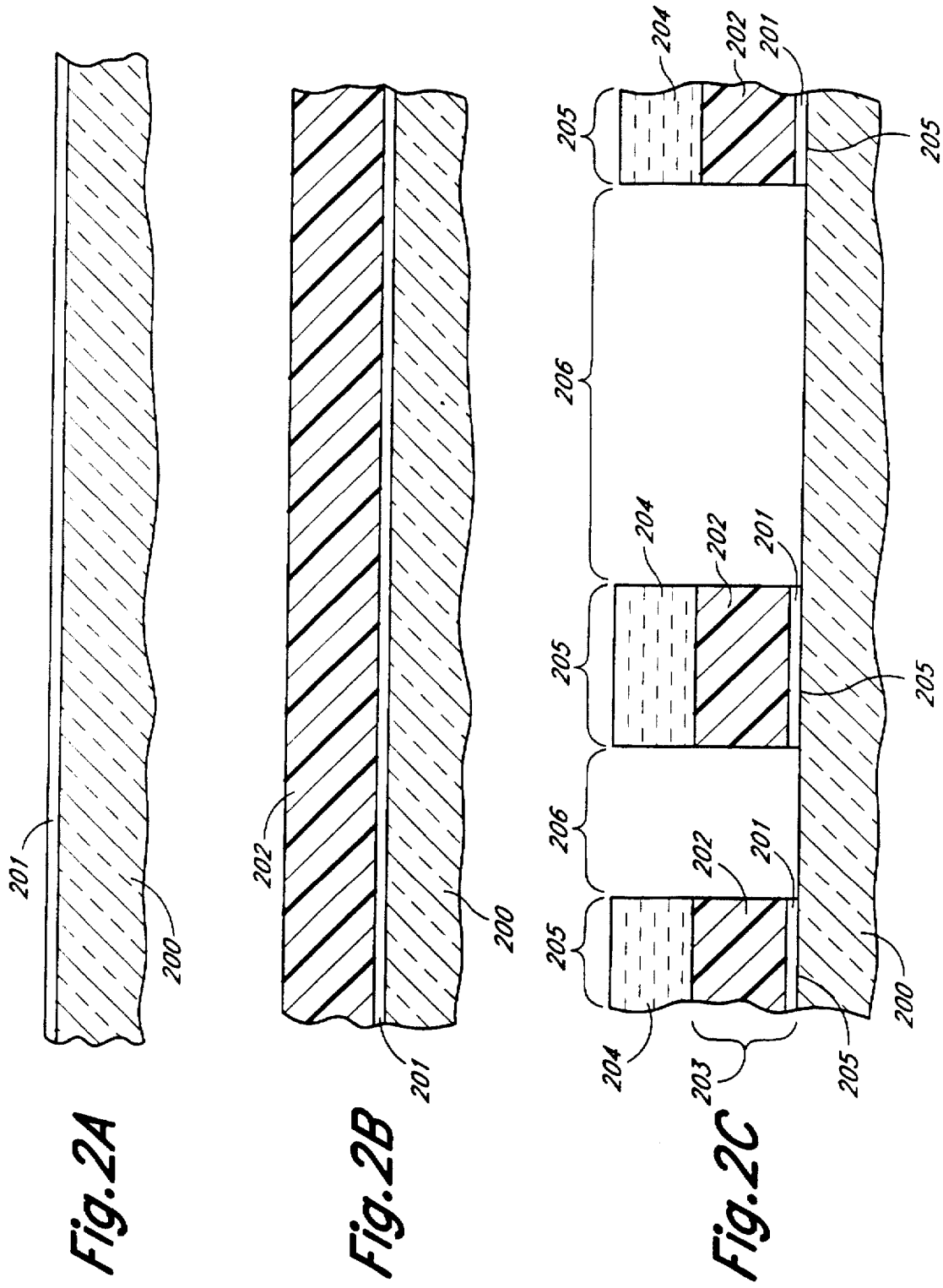

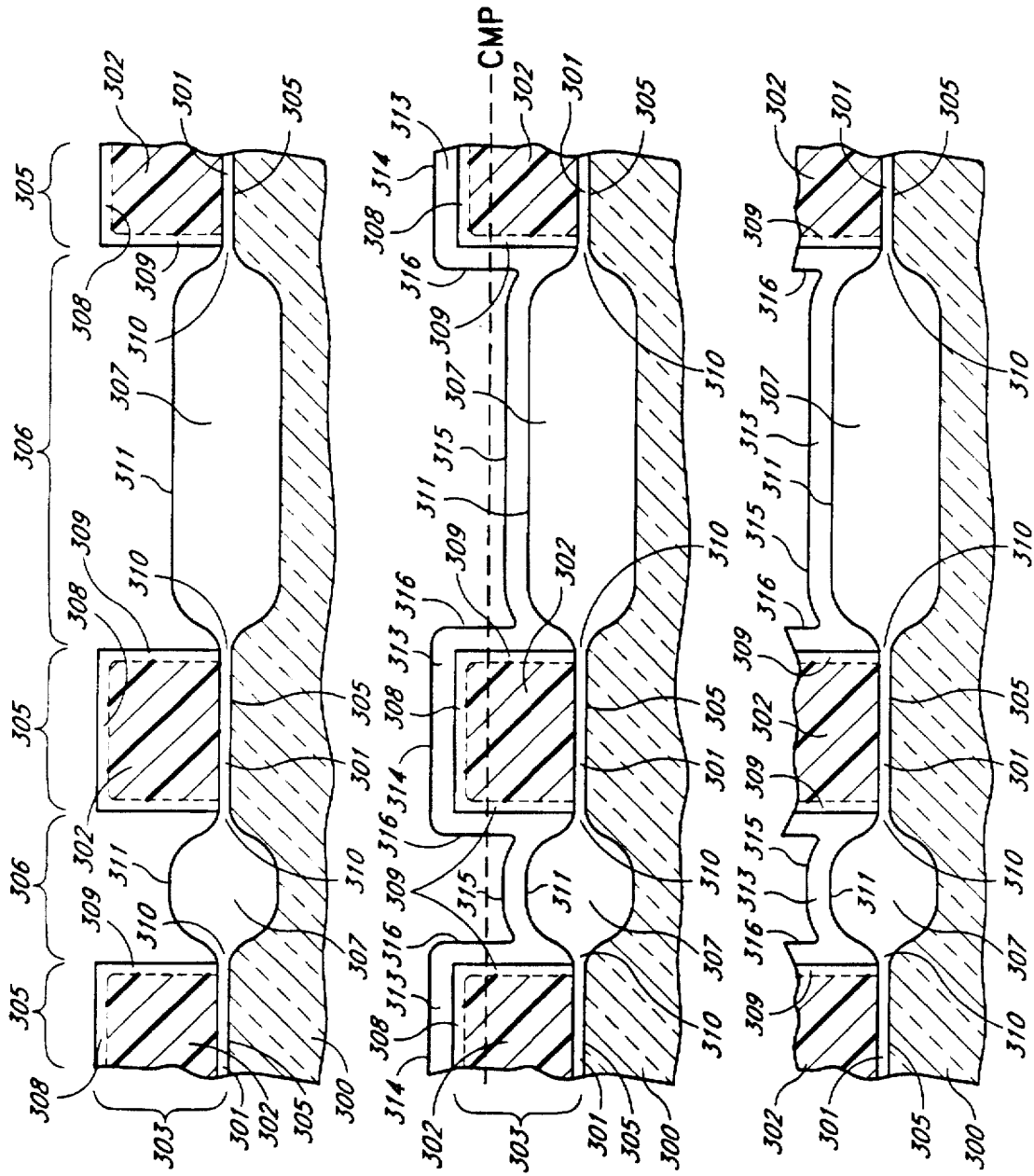

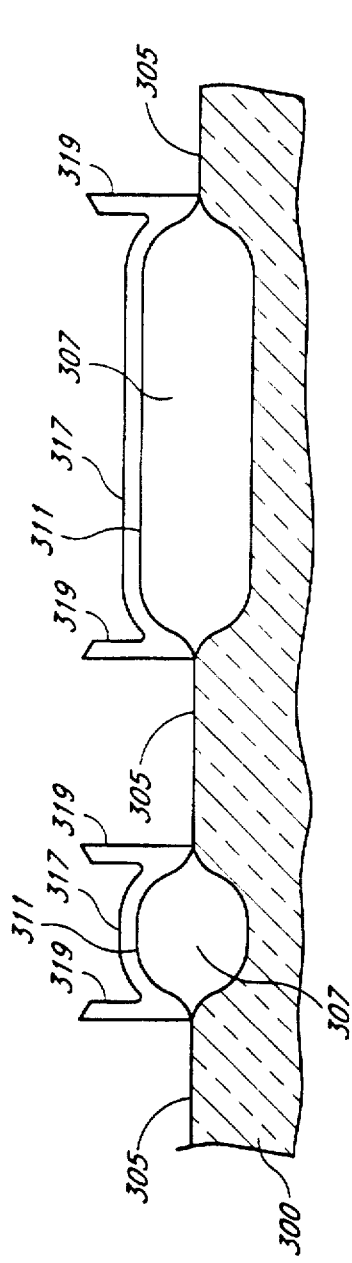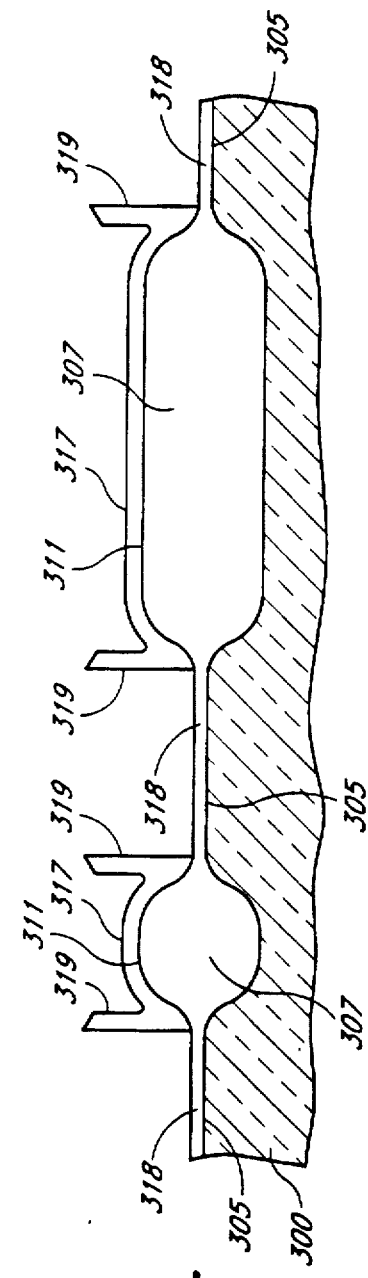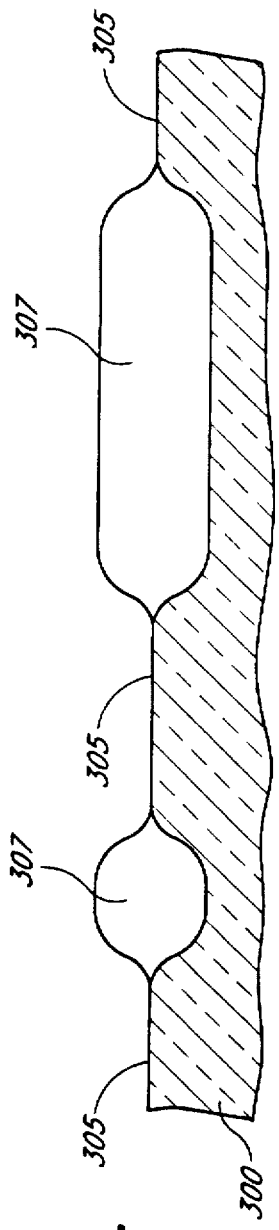

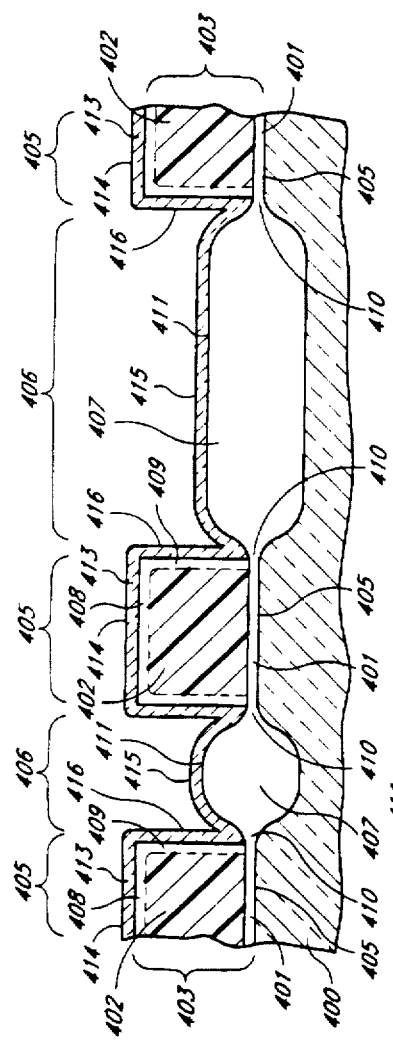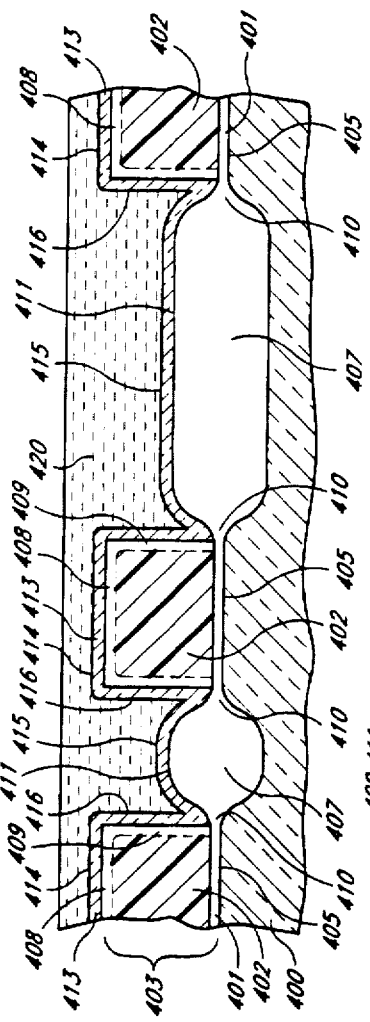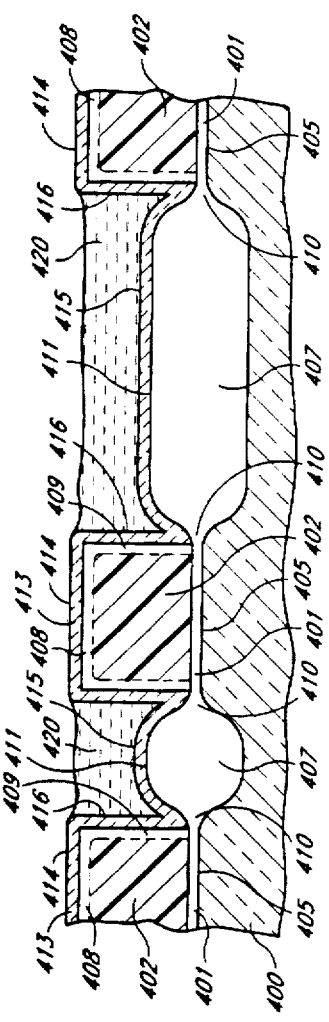

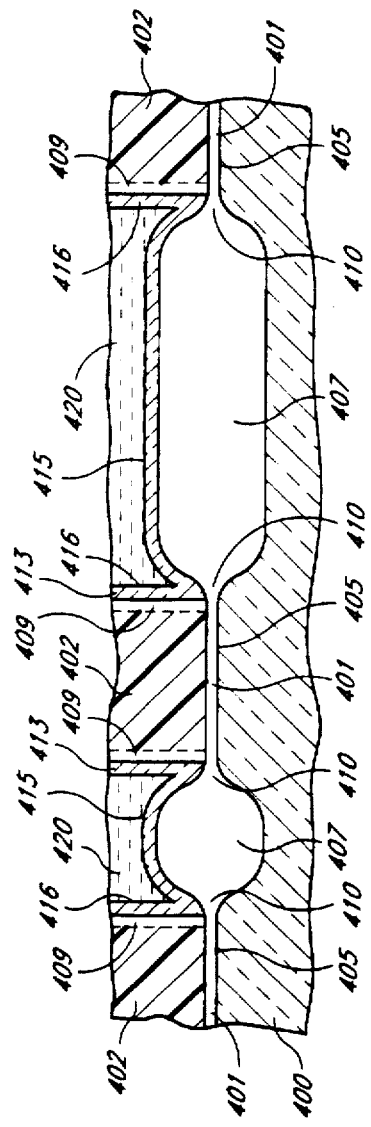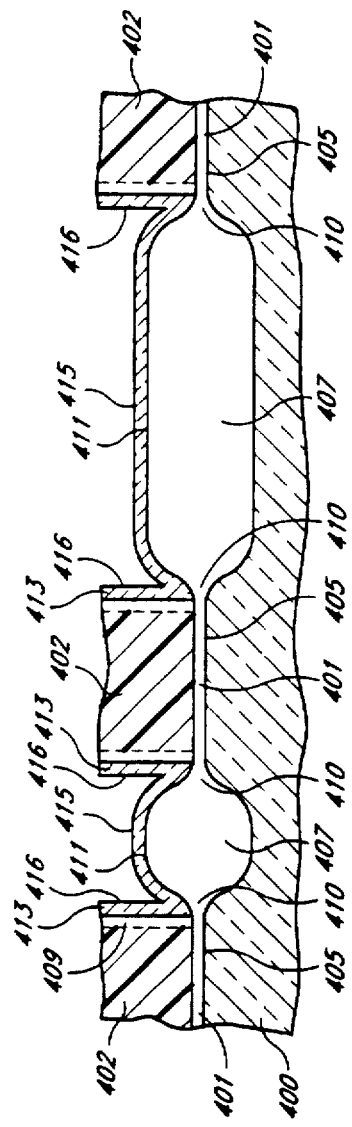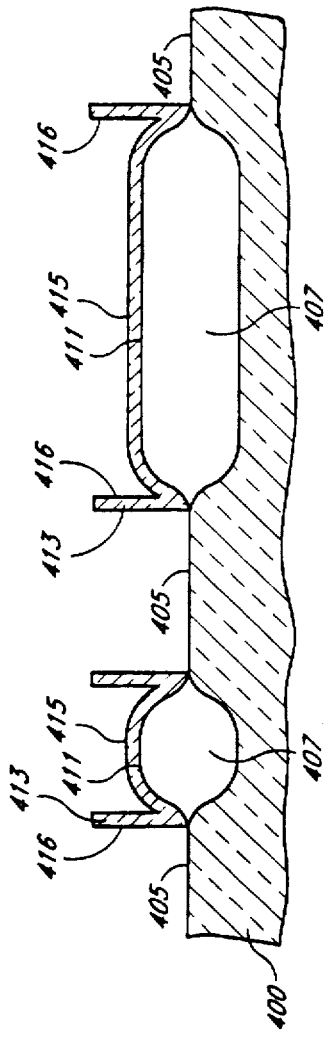

MODIFIED LOCOS PROCESS FOR SUB-HALF-MICRON TECHNOLOGY

BACKGROUND OF THE INVENTION

1. Field of the Invention

This invention generally relates to semiconductor integrated device design and fabrication, and more particularly to techniques for isolating active areas in VLSI memory arrays such as dynamic random access memories (DRAM).

2. Description of the Related Art

In Metal-Oxide-Semiconductor (MOS) manufacturing technology, there is a trend of ever increasing integration, i.e., more devices per wafer. This trend of increasing integration is accompanied by a corresponding decrease in device dimensions which makes device isolation one of the critical aspects of current manufacturing processes which leads to Ultra Large Scale Integration (ULSI) devices.

This is of particular relevance to the manufacture of DRAM memory devices. Specifically, as the dimensions of individual memory cells in a DRAM array continue to shrink, the need for efficient and reliable isolation processes to separate active device regions dramatically increases. In fact, known processing techniques have become increasingly inefficient to be used for memory cells, and other devices, having sub-micron dimensions. Consequently, radical modifications in conventional processing technologies are needed to extend the use of LOCOS (for LOCal Oxidation of Silicon) isolation technology into sub-half-micron size for 256M DRAM generation.

LOCOS processing is widely used for device isolation applications in the semiconductor industry. The flow-chart in FIG. 1 summarizes the sequence of process steps followed in the conventional LOCOS isolation technique. Initially, a thin layer of pad oxide, usually a silicon dioxide layer having a typical thickness range of 40 Å to 300 Å, is grown over the wafer surface. The function of this layer is to prevent transition of stresses between the silicon substrate and the subsequently deposited layers. Following this, a layer of silicon nitride mask, having a typical thickness of 2000 Å, is deposited on top of the pad oxide layer and lithographically defined to retain the nitride over the active device regions of the wafer. The nitride layer is etched from the area between the active device areas where an isolating silicon dioxide layer, which is known as field oxide, is to be grown.

Unfortunately, there are problems associated with growing these field oxide regions with the conventional LOCOS process. In fact, the most important problem with the LOCOS process arises when field oxide begins to encroach under the nitride stack into the active device regions as it is grown. This oxide encroachment under the nitride stack exhibits itself with a slowly tapering edge profile, and is often named "bird's beak" region, due to its shape. The bird's beak regions in the wafer limit the usable active device areas and, consequently, a large area on the chip is typically lost after the field oxidation is complete. Further, the stress originating from the encroaching oxide layer and the resisting masking stack increases the overall stress level in the wafer which results in increasing stress induced defects. These stress induced defects increase the junction leakage current and, as such, reduce the overall reliability of the device.

The other important problem with the conventional LOCOS process appears during the masking stack stripping step where the etching solutions used to remove masking stack layers also have the ability to etch the field oxide, thereby creating an insufficiently thin isolation layer. If the adjacent semiconductor devices on a wafer are isolated with such inadequate isolation layers, the risk of adjacent devices to short together is significantly increased.

Still referring to the flow-chart in FIG. 1, once the field oxide has been grown, the masking stack layers remaining over the active areas are sequentially removed using a wet or dry etch. Initially with this etching process, any silicon dioxide formation, e.g., cap oxide, which may have grown on the exposed surfaces of the nitride mask, is etched in a hydro-fluoric acid based oxide etch (Buffered Oxide Etch or BOE). Subsequently, once the nitride is free from the oxide cap (decapping), the nitride layer is then stripped in phosphoric acid etch. Finally, the remaining pad oxide is stripped from the surface of the active areas by applying another buffered oxide etch. As mentioned above, experience shows that this conventional masking stack stripping process usually results in a loss of a field oxide thickness ranging approximately from 500 to 1000 Å due to the etchant agents stripping the exposed field oxide. Further referring to the flow-chart in FIG. 1, an additional loss of field oxide material also occurs during the process steps of growing a sacrificial gate oxide and subsequently etching it in an oxide etch. As a result, the estimated field oxide thickness loss which occurs due to removal of the masking stack layers and the following sacrificial oxide removal varies between the range of 1000 to 1500 Å for a typical LOCOS prepared wafer. However, a loss of material in such magnitudes impairs the isolation characteristics of the field oxides and causes unwanted current flows among the adjacent devices and/or into the substrate.

In conventional processes, the solution of this problem is to grow a thicker initial field oxide layer so as to compensate for subsequent oxide loss. Unfortunately, this approach seems to worsen the problem in another way in that the thickness of the initially grown oxide directly determines the extent of field oxide encroachment (bird's beak). In other words, the thicker the field oxide the more bird's beak encroachment into the active region. This encroachment leads to more stress induced defects in the silicon substrate and these stress induced defects can, in turn, lead to leakage currents from the active devices.

As chip densities increase, each layer or component of the wafer is designed to be smaller and thinner. This is particularly true for field oxide regions grown to isolate adjacent device regions on the wafer. Therefore, there is a need for an improved isolation technique which has an isolation region which is not too thick so as to produce unnecessary encroachment into the active region and stress induced defects and is also sufficiently thick to reduce charge leakage, or other isolation problems between the active regions.

In addition, it should be known that semiconductor device manufacturing is quite complex and time consuming, and therefore expensive. Thus, any simplified processing step or combination of existing processing steps into a single step may greatly reduce the manufacturing time and the cost of the semiconductor devices. Hence, there is also a continuing need to reduce the overall number of processing steps to reduce the overall time and cost associated with each wafer.

SUMMARY OF THE INVENTION

The aforementioned needs are satisfied by the methods of the present invention which provide a wafer that has a plurality of isolation regions and active regions wherein the processing steps used to produce the wafer are configured to minimize the reduction of thickness of the isolation regions during the subsequent processing steps. In other words, the processes of the present invention reduce the need to initially grow larger field isolation regions as these processes are configured to protect the field isolation regions from diminishment during masking stack definition and removal. Hence, the processes of the present invention reduce the amount of bird's beak encroachment and junction leakage current by reducing the need to initially overgrow the field isolation regions to compensate for loss of thickness of the field isolation regions during subsequent processing.

In one aspect of the present invention, masking material is positioned on the first side of the wafer. Subsequently, the masking material is defined and etched to expose regions of the substrate of the wafer and to define masking stacks. The field oxidation regions are then grown in the exposed regions at a first thickness. The top of the masking stack is then selectively exposed so that the masking material is exposed in such a way so that the thickness of the field isolation regions is maintained at the first thickness.

It will be appreciated that cap oxides are typically grown on the top surface of the masking stack during the field isolation region growth step. In the prior art, removal of these cap oxides results in a diminishment of the thickness of the field isolation regions. In one embodiment of the invention, the cap oxides are removed by chemical mechanical polishing (CMP) which exposes the underlying masking material without having any effect on the thickness of the field isolation regions.

In another embodiment, a sacrificial passivation layer is deposited over the field isolation regions. The sacrificial passivation layer protects the underlying field isolation regions during subsequent removal of cap oxides and the masking stack. The sacrificial passivation layer and the cap oxides on the top surface of the masking stacks can be either removed through CMP or through selective etching.

In one particular implementation, the sacrificial passivation layer is comprised of a silicon dioxide layer that is deposited over the masking stacks and the field isolation regions. The layer is preferably removed from the top of the masking stacks through CMP and the masking stack is then etched. In another particular implementation of this embodiment, the sacrificial passivation layer is comprised of a polysilicon layer that is deposited over the isolation regions and the masking stacks. A buffer material, such as photo-resist, can then be deposited over the polysilicon layer. Subsequently, the buffer material and the polysilicon layer positioned over the upper surfaces of the masking stacks can be removed through selective etching and the masking stacks can then subsequently be removed.

Preferably, the sacrificial passivation layer has a thickness selected so that, when a sacrificial layer is grown onto the wafer after removal of the masking stack and is then subsequently etched, the thickness of the field isolation regions are substantially the same as their initial deposited thickness. Hence, the sacrificial passivation layer is etched thereby protecting the underlying field isolation region from losses which reduces the need to overgrow the underlying field isolation region from the final desired thickness.

It will be appreciated that the processes of the preferred embodiments are configured to permit the initial growth of the field isolation regions to be closer to their desired thickness. This reduces the bird's beak encroachment into the active areas and otherwise reduces the stress induced defects and junction currents in the active areas. Further, with regards to the embodiments that use CMP, processing steps can be avoided which reduces the costs associated with the manufacturing of the wafers.

The aforementioned objects and advantages of the present invention will become more fully apparent from the following description taken in conjunction with the accompanying drawings.

BRIEF DESCRIPTION OF THE DRAWINGS

FIG. 2A is a schematic section of a silicon wafer having a pad oxide layer grown on top of it;

FIG. 2B is a schematic view of the wafer shown in FIG. 2A wherein a layer of silicon nitride has been deposited on top of the pad oxide layer on the top of the silicon wafer;

FIG. 2C is a schematic view of the wafer shown in FIG. 2B wherein a photoresist has been deposited on top of the nitride masking stack, and the masking stack has been patterned and etched to expose field oxide regions of the substrate;

FIG. 3A is a schematic view of a silicon wafer having a defined nitride masking stack on top of it, and the field oxide isolation layers have been grown over the exposed regions of the wafer;

FIG. 3B is a schematic view of the wafer shown in FIG. 3A wherein a high temperature oxide layer has been deposited on top of the wafer;

FIG. 3C is a schematic view of the wafer shown in FIG. 3B wherein the high temperature oxide layer has been planarized by CMP to expose the nitride layers in the masking stacks;

FIG. 3D is a schematic view of the wafer shown in FIG. 3C wherein the masking stack layers have been stripped from the wafer;

FIG. 3E is a schematic view of the wafer shown in FIG. 3D wherein a sacrificial oxide layer has been grown on top of the wafer;

FIG. 3F is a schematic view of the wafer shown in FIG. 3E wherein the sacrificial oxide on top of the wafer has been stripped;

DETAILED DESCRIPTION OF THE PREFERRED EMBODIMENTS

Figure 1:
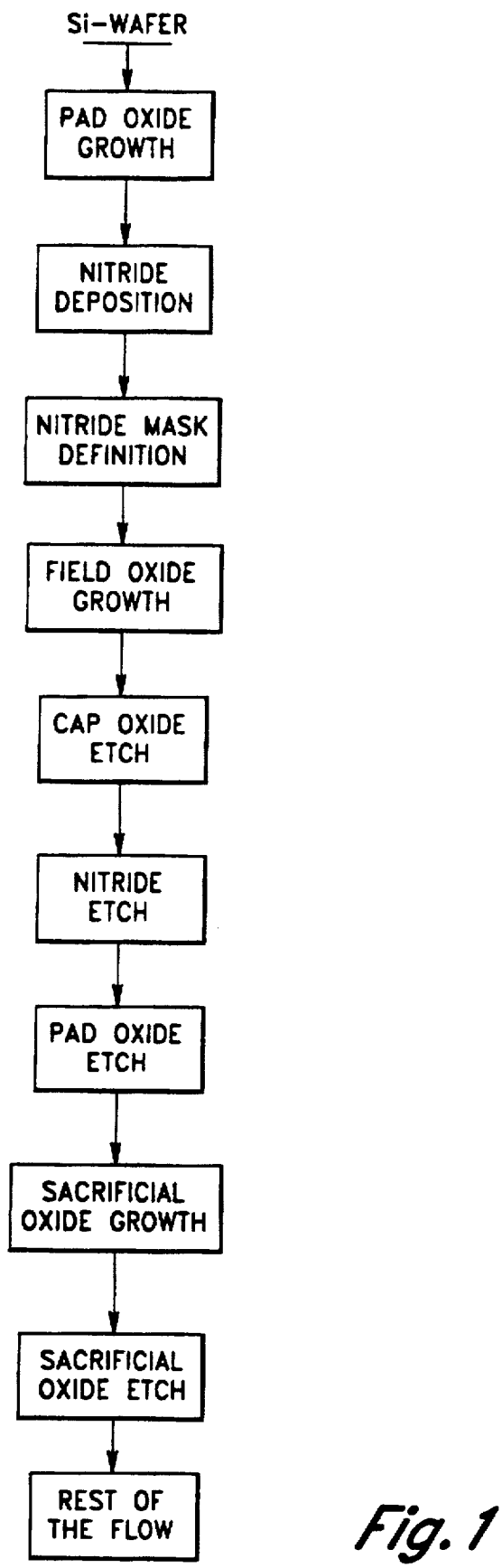
FIG. 1 is an exemplary flow-chart representing the flow sequence for a conventional LOCOS-based process of the prior art.

Reference will now be made to the drawings wherein like numerals refer to like parts throughout. As an improvement to conventional LOCOS technique, the processes of the preferred embodiments preferably minimize the field oxide losses occurring during the masking stack removal steps and permit the initial growth of field oxide layers to a required final-thickness thereby reducing the problems, e.g., increased bird's beak, etc., associated with initially growing an over-thick oxide region to compensate for subsequent loss of a portion of the field oxide regions during subsequent oxide removal steps.

FIG. 2A illustrates a semiconductor wafer having a substrate 200 wherein a thin layer of silicon dioxide 201, known as pad oxide, has been grown thereon with a thickness on the order of approximately 40 Å to 300 Å. As shown in FIG. 2B, a layer of silicon nitride 202 (nitride) is then deposited over the pad oxide layer 201 with a thickness on the order of approximately 2000 Å. Hence, as illustrated in FIG. 2C, the process is followed by the patterning of the nitride 202 with a photoresist pattern 204 and etching through the photoresist pattern 204 to expose and define a plurality of regions 206 on the silicon substrate 200 where field oxide isolation regions will be formed, as described hereinbelow. Subsequent to defining the regions 206 for the field oxide isolation layers, the remaining portions of the photoresist layer 204 on top of the remaining nitride masking stack 203 is stripped off using well-known techniques.

Figures 2D, 2E, 2F:
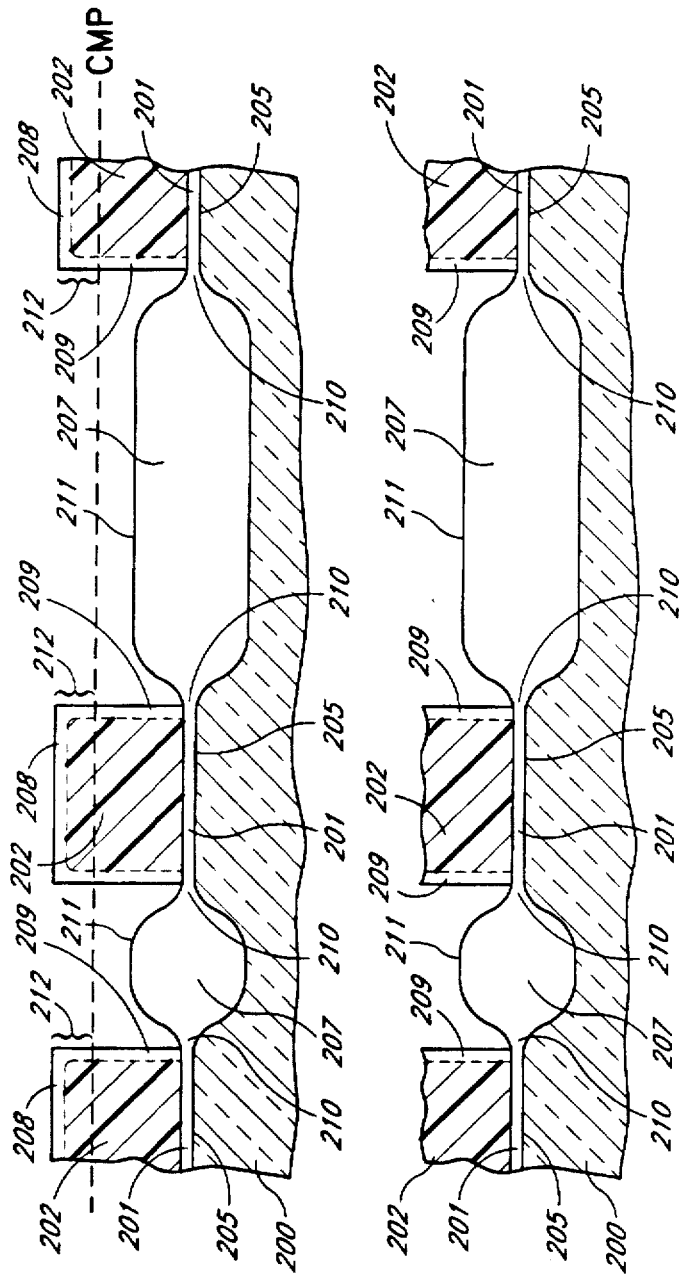
FIG. 2D is a schematic view of the wafer shown in FIG. 2C wherein field oxide isolation layers have been grown into the wafer substrate.
FIG. 2E is a schematic view of the wafer shown in FIG. 2D wherein the chemical mechanical polishing (CMP) process has been applied to the top portions of the nitride masking stacks.
FIG. 2F is a schematic view of the wafer shown in FIG. 2E wherein the nitride masking stacks have been planarized by CMP to expose the nitride layers in the masking stacks.

As illustrated in FIG. 2D, a plurality of field oxide isolation layers 207 are then grown at the exposed regions 206 of the silicon substrate 200. The oxidation is preferably carried out in a wet or steam ambient at a temperature in the approximate range of 1000° C. In this embodiment, the field oxide layers 207 are grown to a thickness of approximately 1800 Å, which more closely approximates the desired final thickness of the field oxide regions or layers 207, rather than the approximately 2000 Å needed for prior art processes. It will be appreciated that the growth of the field oxide region 207 also results in a thinner layer of cap oxide 208, 209 being formed on the outside surfaces, i.e., the sides and the upper surface, of the nitride stack 203 as a result of the nitride stack 203 also being somewhat oxidized during the wet oxidation procedure.

Hence, this preferred process departs from the conventional LOCOS techniques by growing the field oxide layer 207 to a lesser thickness, typically 200–300 Å less than the initial thickness of the field oxide layers grown in prior art techniques. Although the additional thickness in the prior art LOCOS techniques is removed from the top of the field oxide layer 207 during the subsequent cap oxide 208, 209 (FIG. 2E) stripping steps (decapping), the increased initial thickness of the field oxide layer 207 results in more field oxide encroachment 210 into the active areas 205 and more rugged surface topography. In particular, a rugged wafer surface created by the thick isolation layers 207 may cause serious mask alignment problems during the manufacturing of the devices for sub-micron size applications. Further, increased encroachment 210 originating from the thicker field oxides 207 raises the stress level in the substrate 200, causing stress induced defects to increase, especially at the interface between the field oxide isolation region and the active area. Finally, these stress induced defects cause increased junction-leakage-current problems which impair or destroy the operation of devices such as the DRAM cells formed in the active area 205.

Referring further to FIG. 2D, the field oxide layers 207 grown in the exposed regions 206 of the substrate 200 have a step portion 211 which extends above the original surface of the exposed regions 206 of the wafer 200. This step portion 211 is typical for all LOCOS grown field oxides 207 and, as a general rule of thumb, the height of the step from the original wafer surface level is approximately equal to 55–60% of the total thickness of the field oxide layer 207. Therefore, in this embodiment, the field oxide step 211 height is approximately 1000 Å above the original surface of the wafer for the approximately 1800 Å total thickness of the field oxide layer 207. As a result of the formation of the field oxide isolation layers 207, a rather rugged surface topography, comprising the field oxide steps 211 and the nitride stack pillars 203, is formed on the wafer 200. Typically, in this embodiment the nitride stack pillars 203 are at least 1000–1500 Å higher than the field oxide steps 211.

As illustrated in FIGS. 2E and 2F, after the growth of field oxide isolation layers 207, the top portion 212 of the nitride stacks 203 is removed by preferably using a known Chemical Mechanical Polishing (CMP) technique. In this embodiment the CMP technique is employed to scrape off the top 500 Å thick portion 212 of the nitride stacks 203 to remove the top part of the cap oxide 208. The cap oxide 208, 209 formation is an important drawback in the wet etch removal of the nitride layer 202, since the cap oxide cannot be etched by the etchants used to remove the nitride layer 202, such as hot phosphoric acid ($H_3PO_4$). In the known art, the solution of this problem is to perform a buffered oxide etch (hydrofluoric acid etch) step, prior to the nitride etching in phosphoric acid. However, the etchants used to etch the cap oxide layer 208, 209 can also etch the field oxide layer 207 thereby causing field oxide losses. In fact, during a typical decapping process, a thickness of oxide, typically varying between 200 Å and 500 Å from the top of the field oxide, may be lost. As previously explained, besides the negative effects of this loss on the manufacturing time and the cost, a preventive technique such as growing a thicker initial field oxide 207 can also complicate the problem in the sub-micron applications. In this respect, the present invention provides a unique technique to prevent the field oxide loss occurring during the cap oxide 208, 209 removal. In the inventive process, the use of the Chemical Mechanical Polishing (CMP) technique saves an approximately 200 Å thick portion of the field oxide while removing the top portion of the cap oxide 208 and some underlying portion of the nitride stack 202.

In general, known CMP processes involve a polishing pad made of artificial fabric, such as a polyester felt, polyurethane laminate. Wafers are mounted on a fixture, pressed against the pad under high pressure, and rotated relative to the pad. A controlled amount of polishing slurry, which is dripping onto the pad, does the actual polishing process, i.e., both the mechanical and the chemical polishing. In general, the slurry is a colloidal suspension of fine abrasive particles in an aqueous solution of chemical etchants. The combined effect of chemical reaction and mechanical abrasion removes the material from the surface of the wafer. In accordance with the principles of the present invention, a preferred example of CMP slurry comprises primarily KOH (potassium hydroxide), water and fine $SiO_2$ particles (100–250 Å diameter).

Hence, in contrast to the prior art processes, the present invention employs a CMP technique to remove the top portion 208 of the cap oxide, prior to a nitride stack etch. Further, in the embodiment of the process described herein, the partial removal of the cap oxide 208, 209 with the CMP technique contributes substantially to the improvement of the field oxide isolation processes. In particular, the silicon dioxide etchant (buffered oxide etch) used during the prior art stripping process of the cap oxide 208, 209 also etches the field oxide isolation layers 207 and exacerbates the field oxide loss. In this embodiment, the CMP method exploits the fact that the nitride stack 203 will be higher, e.g., on the order of 500–1000 Å higher such as in this embodiment, than the highest point on the field oxide step 211. In particular, very uniform erosion rates with the CMP method can be accomplished by having a uniform distribution of the nitride stacks 203 on the wafer 200.

Figure 2G:
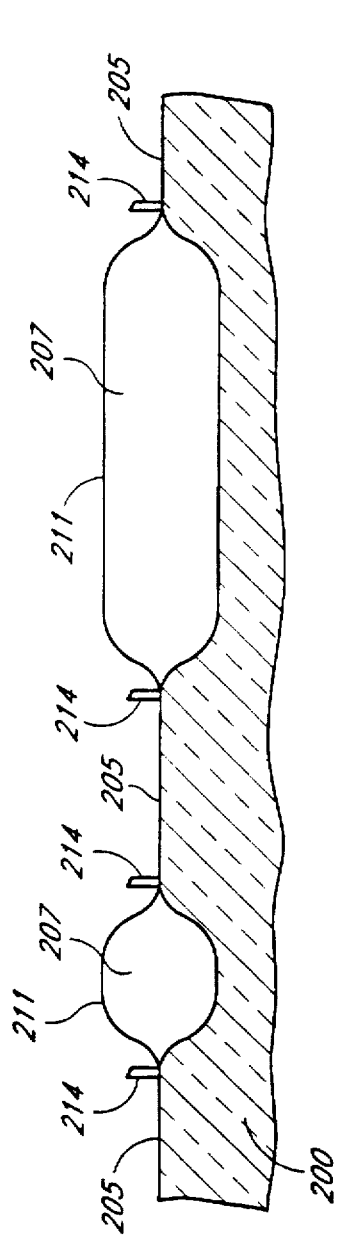
FIG. 2G is a schematic view of the wafer shown in FIG. 2F wherein the masking stack layers have been stripped from the wafer.

As illustrated in FIG. 2F, following the CMP step, the remaining nitride 202 and the pad oxide 201 layers are sequentially removed from the substrate 200. The removal of the masking stack layers 203 can be done by the use of sequential wet etchants. Preferably, in this embodiment, the nitride layer 202 is stripped in hot phosphoric acid ($H_3PO_4$) at an approximate temperature of 180° C. As shown in FIG. 2G, once the nitride layer 202 is stripped, the wall portions of the cap oxide layer 209 are exposed on both sides. Hence, during the subsequent etching of the remaining oxide layers, e.g., the pad oxide 201 positioned under the nitride stack 203, the remaining wall portions 209 of the cap oxide are removed at twice the rate as those remaining layers as a result of the etchant reacting with both sides of the cap oxide 209 thereby reducing the need for another buffered oxide etch step to remove the cap oxide layer.

Figure 2H:
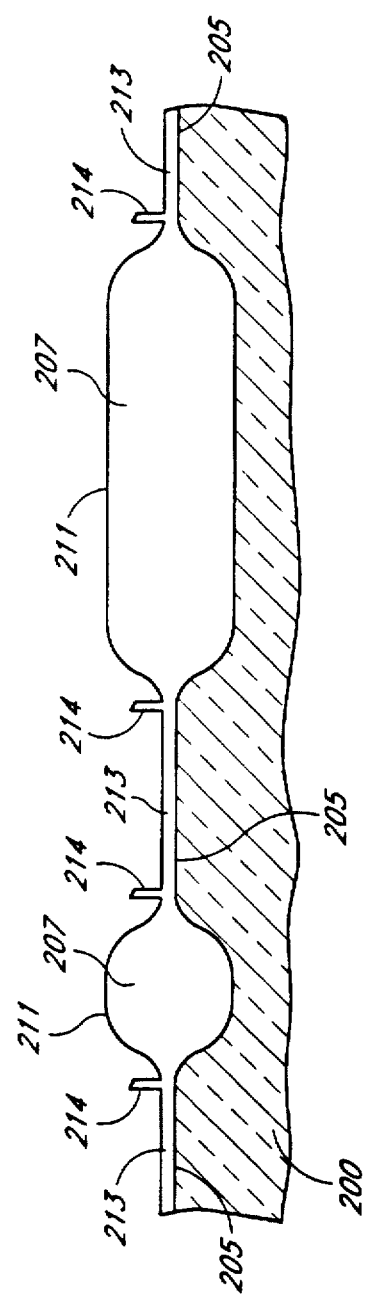
FIG. 2H is a schematic view of the wafer shown in FIG. 2G wherein a sacrificial oxide layer has been grown on top of the wafer.

As illustrated in FIG. 2H, after the masking stack etching, a sacrificial silicon oxide layer 213, which is generally known as the sacrificial oxide or the sacrificial gate oxide, is grown over the exposed active area regions 205. Following its growth, the sacrificial oxide layer 213 is etched off using a buffered oxide etch application. The sacrificial oxide growth and the etching steps are widely used to remove the remaining silicon nitride residues (inclusions) from the surface of the active areas just before growing the gate oxide. However, one or more small cap oxide fragments 214, which may have survived during the previous etch steps, may also be completely etched away by the assistance of the sacrificial oxide etch.

Figure 2I:
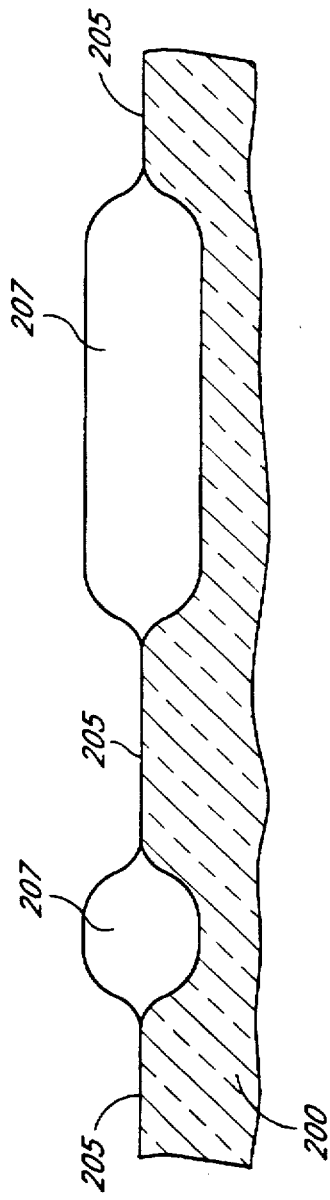
FIG. 2I is a schematic view of the wafer shown in FIG. 2H wherein the sacrificial oxide on top of the wafer has been stripped.

As illustrated in FIG. 2I, the sacrificial oxide layer 213 is removed resulting in the field oxide 207 layers having their required thickness. In the preferred embodiment, following the sacrificial oxide etch, gate oxide growth and the rest of the manufacturing flow proceeds by the normal process steps. It would be understood that the improved LOCOS process provided by this embodiment of the present invention allows for field oxide isolation layers 207 having a lower initial thickness as the field oxide 207 loses less material during subsequent etching due to the use of CMP assisted decapping. In contrast to the conventional LOCOS grown field oxide layers, the capability of growing a less thick field oxide contributes to reduction of the bird's beak growth 210 into the active areas 205 and the associated stresses occurring in the silicon substrate 200. A lower stress level in the silicon substrate 200 leads to less stress induced defects which in turn result in less junction leakages. Specifically, as shown here, the Chemical Mechanical Polishing step prevents the field oxide loss during the stripping of the cap oxide 208, 209 (decapping). Further, using a CMP technique to decap the nitride layer 202 reduces the time for wet nitride etch and eliminates the need for thicker field oxides to begin with. Various modifications may be made to the above described embodiment without departing from the scope of this invention. In addition, it would be understood by those skilled in the art that the above description of the inventive process is exemplified by means of a conventional LOCOS stack for sub-micron applications. However, the inventive process can also be applicable to any advanced sub-micron isolation technique which results in a field oxide step 211 height shorter than the nitride stack 203 height, such as poly buffered LOCOS technique.

FIGS. 3A to 3F illustrate another embodiment of the process of the present invention. As an improvement to first embodiment, this inventive process prevents the field oxide losses occurring during the masking stack removal step by using a sacrificial passivation layer thereby enabling the growth of field oxide layers with the final required thickness.

As illustrated in FIG. 3A, following the removal of the masking stack to expose regions of the substrate 306, a plurality of field oxide isolation regions 307 are grown at the exposed regions of the silicon substrate 306. However, in this embodiment, the field oxide regions are directly grown to the final required thickness, for example, approximately 1500 Å, rather than the approximately 2000 Å needed for prior art processes. At this point the preferred process departs from the conventional LOCOS technique by growing the field oxide layer 307 only to a desired final thickness required in the technology, which is typically 500 Å less than the field oxide layer thickness in the known LOCOS techniques. Although this additional thickness used in the prior art LOCOS technique is gradually removed from the top of the field oxide layer during the subsequent etching steps of the oxide layers formed on the wafer, it results in more field oxide encroachment 310 (a larger bird's beak) under the nitride masking stack and increased stress in the active region 305 as described hereinabove.

Referring further to FIG. 3A, for this particular embodiment, the given field oxide step 311 height is approximately 900 Å above the original surface of the wafer 300 for the approximately 1500 Å total thickness of the field oxide layer 307. As a result of the formation of the field oxide isolation layers 307, a rather rugged surface topography comprising field oxide steps 311 and nitride stack pillars 303 is formed on the wafer 300. As a result of the growth of the field oxide isolation regions 307, a cap oxide layer 308 is formed on the top surface of the masking stack 303 and a cap oxide layer 309 is formed on the side walls of the masking stack 303 in the same manner as described above.

Typically, in this embodiment, the nitride stack pillars 303 are approximately 500 Å higher than the field oxide steps 311.

As illustrated in FIG. 3B, after the growth of field oxide isolation layers 307, a conformal layer of suitable passivation material is deposited on the wafer 300, thus forming a sacrificial passivation layer 313 comprised of a continuous film with uniform thickness covering the exposed surfaces of the masking stack pillars 303 and field oxide isolation layers 307. In this embodiment, the sacrificial passivation layer 313 is comprised of a layer of silicon dioxide with a preferred thickness of approximately 500 Å.

As described below, the conformal sacrificial passivation layer 313 serves as a protective coating for the underlying field oxide layers 307 during removal of components of the masking stack and is evenly eroded throughout the etch processes that remove the pad oxide layer 301 and the sacrificial oxide layer 318. Preferably, the sacrificial passivation layer 313 is deposited using a deposition technique that deposits the layer uniformly across the wafer 300 to the desired thickness. In this embodiment, a high temperature low pressure chemical vapor deposition (LPCVD) silicon dioxide deposition technique is used as it provides the required uniformity. Specifically, the LPCVD technique preferably comprises a high temperature "DCS" (for dichlorosilane) oxide deposition which occurs by reacting dichlorosilane ($SiCl_2H_2$) with nitrous oxide ($N_2O$) at temperatures near 900° C. The principal advantage of a DCS based oxide deposition technique in this embodiment is that the thickness of a portion 316 (FIG. 3B) of the sacrificial passivation layer 313 adjacent the side walls of the nitride stack is substantially the same as the thickness of both a portion 314 of the sacrificial passivation layer 313 adjacent the top of the nitride stack 303 and the portion 315 of the sacrificial passivation layer 313 adjacent the top of the field oxide layers 307.

As illustrated in FIG. 3C, once the high temperature oxide passivation layer 313 is uniformly coated on the field oxide layers 307 and on the nitride stacks 303, the portion 314 of the oxide passivation layer on the top of the nitride stacks 303 and the underlying cap oxide 308 are removed by using a known chemical mechanical polishing (CMP) technique. Preferably, the CMP process removes the top portion 314 of the passivation layer, the top portion 308 of the cap oxide formed on the masking stack 303 and only a portion of the underlying nitride masking material 302. Specifically, in the embodiment shown in FIG. 3A–3F, about 600 Å of material is removed from the top portion of the masking stacks 303 as a result of the CMP process.

Hence, in contrast to the prior art processes, the present invention employs a CMP technique to remove the top portion of the cap oxide to expose underlying nitride for the subsequent etch step. Further, in this embodiment of the process, the removal of the top portion of the cap oxide 308 using the CMP technique contributes substantially to the improvement of the field oxide isolation processes as it reduces the need to use oxide etchants to remove the cap oxide portions 308, 309 and thereby reduces the need to increase the thickness of the field oxide regions 307 to account for loss in subsequent etching procedures. As is the case in the first embodiment, the CMP method exploits the fact that the nitride stack 303 will be higher, e.g., on the order of 1200–2000 Å higher in this embodiment, than the highest point on the field oxide step 311. Hence, the portion 315 of the sacrificial passivation layer 313 on the field oxide 307 is not eroded and remains at essentially its originally deposited thickness.

As illustrated in FIG. 3D, following the CMP step, the remaining nitride 302 and the pad oxide 301 layers are sequentially removed from the substrate 300. This results in a partially etched portion 317 of the DCS oxide passivation layer remaining on the field oxide regions 307 and a partially etched portion 319 of the layer remaining on the sidewalls of the nitride stack 303. The removal of the masking stack layers 303 can be done by the use of sequential wet etchants. Preferably, in this embodiment, the nitride layer 302 is stripped in hot phosphoric acid ($H_3PO_4$) at an approximate temperature of 180° C. Once the nitride layer 302 is stripped, the wall portions 319 of the passivation layer 313 is exposed on both sides. Hence, during the subsequent etching of the pad oxide 301 and any remaining cap oxide 309 by buffered oxide etch, the wall portions 319 of the passivation layer 313 are removed at twice the rate as the portions 317 of the passivation layer 313 on top of the field oxide regions 307. Hence, with this two fold etching rate, the wall portion 319 of the oxide passivation layer will preferably be completely removed as the portion 317 of the passivation layer 313 on the field oxide step 311 is etched away to expose the field oxide layers 307 in the manner described hereinbelow.

FIG. 3E illustrates that, after the masking stack 303 etching, a layer of sacrificial gate oxide 318 is grown over the active area regions 305 while the remainings of the DCS oxide passivation layer 317, 319 still cover the surface of the field oxide layers 307. As is previously explained, the sacrificial oxide growth 318 and the etching steps are commonly used to remove the nitride inclusions from the active areas. However, in the present embodiment, a single step sacrificial oxide etch removes advantageously both the sacrificial oxide 318 and the remaining portions 317, 319 of the passivation layer 313. In the preferred embodiment, the growth of the sacrificial oxide layer 318 is carried out in a wet or steam ambient at an approximate temperature of 1000° C. and for a thickness range of approximately 200 Å so as to substantially match the thickness of the remaining residue portion 317, 319 of the oxide passivation layer 313.

As illustrated in FIG. 3F, the sacrificial oxide layer 318 along with the remains of the passivation layer 317, 319 is etched in a buffered oxide etch. Consequently, the sacrificial oxide etch results in the field oxide layers 307 having their initial thickness. Following the sacrificial oxide etch, gate oxide growth and the rest of the manufacturing flow is proceeded by the normal process steps.

It will be appreciated that the sacrificial passivation layer 313 should preferably have an optimum thickness to survive the etch steps used to remove the masking stack 303 and the pad oxide region 301. Preferably, the thickness of the sacrificial passivation layer 313 is selected so that the sacrificial passivation layer 313 is completely removed at the end of the removal of the sacrificial oxide layer 318.

It would be understood that the improved LOCOS process provided by this embodiment of the present invention allows for field oxide isolation layers 307 having a lower initial thickness as the field oxide layer 307 is not losing material during subsequent etching due to the use of a silicon dioxide sacrificial passivation layer 313 and the CMP assisted decapping. In contrast to the conventional LOCOS grown field oxide layers, the capability of growing a field oxide region as thin as the desired final thickness reduces the bird's beak growth 310 into the active areas and the stresses occurring in silicon substrate 300. A lower stress level in silicon substrate 300 leads to less stress induced defects which in turn result in less junction leakages. Specifically, as shown here, the high temperature oxide passivation layer 313 deposited after the field oxide 307 growth compensates for the oxide loss during the strip of the cap oxide 308, 309, the pad oxide 301 and the sacrificial oxide 318. Further, using a CMP technique to decap the nitride layer 302 after the high temperature sacrificial passivation layer 313 deposition substantially improves the conventional LOCOS process and eliminates the need for thicker field oxides to begin with, thus reducing the cost and the manufacturing time. This improved performance provided by the present embodiment in terms of reduced encroachment 310 into the active areas 305 may enable the present embodiment to be used in the manufacturing of sub-half-micron size devices, and in particular high performance DRAM devices.

FIGS. 4A to 4G illustrate yet another embodiment of the process of the present invention. In this embodiment, the high temperature DCS silicon dioxide layer, from which the sacrificial passivation layer 313 described in reference to the process shown in FIGS. 3A–3F is formed, may be replaced with another material, most preferably, a polysilicon layer deposited in accordance with the process described below.

As illustrated by FIG. 4A, a wafer 400 having a plurality of masking stacks 403, comprised of a pad oxide layer 401 and a nitride layer 402, is formed in the same manner as described above. Subsequently, portions of the nitride layer 402 are etched to expose the underlying wafer and field oxide isolation layers or regions 407 are then formed in the wafer 400 between the remaining masking stacks 403 in the manner described above.

Following the growth of field oxide isolation layers 407, a polysilicon passivation layer 413 is deposited on the wafer 400 in a manner that the polysilicon layer 413 conforms to the surface topography of the upper surface of the wafer 400 thereby covering field oxide steps 411 and nitride stacks 403. As described above, the conformal passivation material 413 serves as a protective coating for the underlying field oxide layers 407 to prevent the undesired etching of the field oxide layers, i.e., field oxide loss, during the nitride masking stack stripping process. In this respect, the use of a conformal polysilicon layer 413 also provides an opportunity to grow thinner field oxide isolation layers 407, and thereby less field oxide encroachment 410 into the active areas 405. Specifically, the polysilicon layer 413 can be deposited on the silicon wafer 400 using any of a number of well-known techniques. In this embodiment, LPCVD technique is used to form a conformal polysilicon layer 413 over the surface of the silicon wafer 400. LPCVD polysilicon is preferably deposited by pyrolizing silane ($SiH_4$) at approximately 625° C. to a preferred thickness of approximately 100 Å. Due to its imperviousness to the etching solutions used to strip nitride stack layers 403, the polysilicon layer 413 remains intact until the process step of sacrificial oxide growth, and thus protects the field oxide regions 407. Therefore, unlike the DCS oxide passivation layer 313 in the previous embodiment, the polysilicon layer 413 is ultimately removed at a single etching step comprising sacrificial oxide etch. However, this is particularly advantageous, since the thickness of the sacrificial oxide 418 is the only criteria to determine the thickness of the polysilicon passivation layer 413.

FIG. 4B illustrates that, once a conformal layer of polysilicon 413 is formed on the field oxide layers 407 and the nitride stacks 403, a protective buffering material 420 is deposited on top of the wafer 400 to a selected thickness sufficient to fill all the gaps between the adjacent nitride pillars 403 and to cover their upper surfaces 414 elevationally thereby providing a planar upper surface on the wafer 400. This protective buffering material 420 is preferably comprised of a photoresist material and can be deposited using any of a number of well-known techniques in the art. As it would be understood in the following processing steps, the buffer material 420 assists in later dry etching process steps in preventing undesired etching of the lower-lying portions 415 of the polysilicon layer, i.e., polysilicon layer over the field oxide regions 407. Therefore, the buffer material 420 should be selectively etchable relative to the polysilicon layer 413. Furthermore, the buffer material 420 reinforces the entire array of nitride stacks 403, during the dry etching, by filling the space 406 between the nitride stacks 403.

As illustrated in FIG. 4C, after the deposition of photoresist material 420 on the wafer 400, a dry etch step is conducted to etch photoresist 420 selectively relative to the polysilicon 413, thereby exposing the regions 414 of the polysilicon conformal layer 413 on top of the nitride stacks 403. In this embodiment, an $O_2$ plasma etch is preferably carried out to etch the photoresist layer 420 selectively until the upper common surface 414 level of the nitride stacks is reached. However, the remaining photoresist 420 still fills the space 406 between the nitride stacks 403, thus covering the conformal polysilicon portion 415 over the field oxide layers 407. In fact, as an intermediate processing step, dry etching of the photoresist layer 420 prepares the wafer surface for a further dry etching step so that only the exposed polysilicon portions 414 can then be selectively etched.

As illustrated in FIG. 4D, following the partial dry etching of the photoresist layer 420, another dry etch step is performed to remove the exposed portion 414 of the polysilicon layer and the underlying cap oxide layer 408 to expose the nitride layer 402. Similar to the photoresist etch step, an exemplary dry etch is preferably carried out by utilizing a gas plasma etch technique. In this step, however, the etchant gas composition comprises a mixture of $CF_4$ and $CHF_3$ gases which may be highly selective to polysilicon and silicon dioxide, and poorly selective to the photoresist and the nitride, i.e. the etchant gas can significantly etch the polysilicon layer 414 and the cap oxide 408 with a minimal etching effect on the photoresist 420 and the masking nitride 402. Thus, during the plasma etch, the exposed part of the polysilicon passivation layer 414 and the underlying cap oxide 408 are etched at the same time and down to the nitride layer 402 where the etch process effectively stops, i.e., the nitride stack is decapped. Correspondingly, the remaining photoresist 420 over the field oxide regions 407 acts as an etch stop layer and prevents underlying polysilicon 415 from being etched away.

As illustrated in FIG. 4E, following the dry etching step, the remaining photoresist material 420 is removed to expose the portions 415, 416 of the polysilicon passivation layer 413 which respectively coats the field oxide layer 407 and the nitride stack walls 409. The remaining photoresist 420 can be removed by employing any of the well-known techniques which enable wet or dry etching of the photoresist material. One such preferred photoresist removal process comprises a wet etch using a heated mixture of sulfuric acid ($H_2SO_4$) and hydrogen peroxide ($H_2O_2$) prior to the nitride removal step.

As illustrated in FIG. 4F, following the photoresist removal step, the remaining nitride 402 and the pad oxide 401 layers (masking stack) are sequentially removed from the substrate 400 to expose active areas 405, thereby leaving the unetched portion 415, 416 of the polysilicon passivation layer around the exposed active areas 405 and over the field oxide isolation layers 407. During the masking stack etching, the polysilicon passivation layer 413 seals the underlying field oxide layers 407 and does not allow any field oxide loss. Due to etching selectivity, the wall portions 416 of the polysilicon layer 413 still maintain their vertical position and surround the exposed active areas 405 after the removal of the nitride stack 403. The removal of the masking stack layers 403 can be done by the use of sequential wet etchants. Preferably, in this embodiment, the nitride layer 402 is stripped in hot phosphoric acid ($H_3PO_4$) at an approximate temperature of 180° C. The pad oxide 401 and the remaining cap oxide 409 are preferably stripped in a HF ambient (buffered oxide etch), thus exposing active areas 405.

Figure 4G:
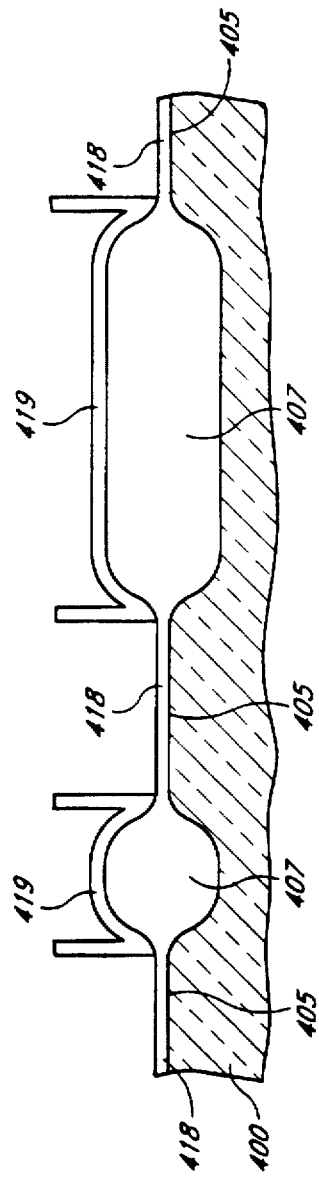
FIG. 4G is a schematic view of the wafer shown in FIG. 4E wherein a sacrificial oxide layer has been grown on top of the wafer; and, FIG. 4H is a schematic view of the wafer shown in FIG. 4F wherein the sacrificial oxide on top of the wafer has been stripped.

After the masking stack etching, a remaining polysilicon spacer layer 416, 415 still covers the surface of the field oxide layers 407. To remove this remaining polysilicon layer 416, 415 a sacrificial oxide layer 418 is grown over the exposed active area regions. In this embodiment, the growth of the sacrificial oxide layer is carried out in a wet or steam ambient at an approximate temperature of 1000° C. and for a thickness range of approximately 100 Å so as to completely oxidize the remaining polysilicon layer 416, 415 into an oxide structure 419, as is shown in FIG. 4G, while growing the sacrificial oxide layer 418 on the active area regions 405. As it would be understood, the growth of a sacrificial oxide layer serves to dispose of the remaining polysilicon passivation layer 413 left on the top of the field oxide layers 407.

Figure 4H:
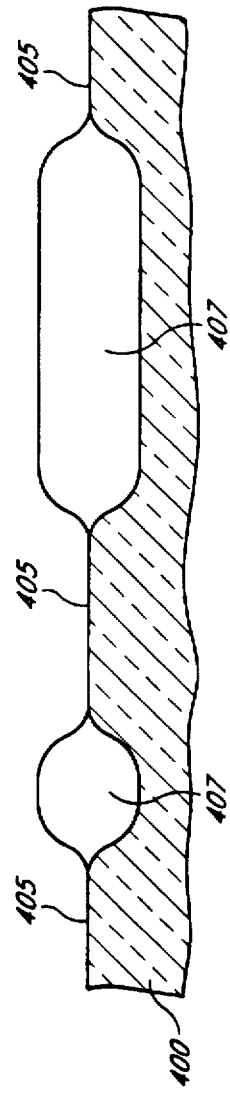
FIG. 4A is a schematic view of a silicon wafer having a defined nitride masking stack and the field oxide isolation regions, wherein a polysilicon layer has been deposited on top of the masking stack and isolation regions.
FIG. 4B is a schematic view of the wafer shown in FIG. 4A wherein a photoresist material has been deposited on top of the wafer.
FIG. 4C is a schematic view of the wafer shown in FIG. 4B wherein the photoresist layer has been planarized by a dry etch process to expose the tops of the nitride pillars in the nitride mask.
FIG. 4D is a schematic view of the wafer shown in FIG. 4C wherein the nitride layers have been planarized by applying another dry etch step.
FIG. 4E is a schematic view of the wafer shown in FIG. 4D wherein the photoresist layer has been stripped from the wafer.
FIG. 4F is a schematic view of the wafer shown in FIG. 4E wherein the masking stack layers have been stripped from the wafer.

As illustrated in FIG. 4H, the sacrificial oxide layer 418 and the oxidized structure 419 are removed resulting in the field oxide layers 407 having their initial thickness. In the preferred embodiment, HF based buffered oxide etch is used to etch the sacrificial oxide layer 418. Following sacrificial oxide etch, gate oxide growth and the rest of the manufacturing flow is proceeded by the normal process steps.

It would be understood that the improved LOCOS process provided by this embodiment of the present invention allows for field oxide isolation layers 407 having a lower initial thickness as the field oxide layer 407 is not losing material during subsequent etching due to the use of a polysilicon sacrificial passivation layer 413. In contrast to the conventional LOCOS grown field oxide layers, the capability of growing a field oxide layer as thin as the desired final thickness reduces the bird's beak growth 410 into the active areas 405 and the stresses occurring in silicon substrate 400. A lower stress level in silicon substrate 400 leads to less stress induced defects which in turn result in less junction leakages. Specifically, as shown here, the polysilicon passivation layer 413 deposited after the field oxide growth prevents the field oxide loss which occurs during the strip of the cap oxide 409, 408, the pad oxide 401 and the sacrificial oxide 418. Further, the use of a sacrificial polysilicon passivation layer 413 substantially improves the conventional LOCOS process and eliminates the need for thicker field oxides to begin with, thus reducing the cost and the manufacturing time. This improved performance provided by the present embodiment in terms of reduced encroachment into the active areas may enable the present embodiment to be used in the manufacturing of sub-half-micron size devices, and in particular high performance DRAM devices.

Hence, although the foregoing description of the preferred embodiment of the present invention has shown, described and pointed out the fundamental novel features of the invention, it will be understood that various omissions, substitutions, and changes in the form of the detail of the apparatus as illustrated as well as the uses thereof, may be made by those skilled in the art, without departing from the spirit of the present invention. Consequently, the scope of the present invention should not be limited to foregoing discussions, but should be defined by the appended claims.

What is claimed:

1. A method of producing a wafer having a plurality of isolation regions, said method comprising the steps of:

positioning a masking material over a first surface of said wafer;

selectively removing portions of said masking material to expose regions of said first surface of said wafer and to define a plurality of masking stacks having side walls and an upper surface;

forming isolation regions in said exposed regions of said first surface of said wafer, wherein said isolation regions have a first thickness; and selectively removing only an upper surface of said masking stacks without reducing said first thickness of said isolation regions by using chemical mechanical polishing (CMP) to remove said upper portion of said masking stacks.

2. The method of claim 1, further comprising the step of removing the portion of said masking stacks remaining after said selectively removing step to expose said first surface of said wafer.

3. The method of claim 2, further comprising the step of positioning a pad oxide layer on said first surface of said wafer prior to positioning said masking material over said first surface of said wafer.

4. The method of claim 3, wherein the step of positioning a masking material on a first surface of said wafer comprises positioning silicon nitride on said pad oxide layer.

5. The method of claim 4, wherein the step of forming isolation regions comprises growing silicon dioxide regions in said exposed regions of said wafer.

6. The method of claim 5, wherein said step of using chemical mechanical polishing (CMP) comprises removing a cap oxide formed on said top surface of said masking stack as a result of said growth of said silicon dioxide isolation region.

7. The method of claim 6, wherein said step of removing the remaining portion of said masking material comprises etching said remaining portions of said masking material using a wet etching procedure.

8. The method of claim 7, further comprising the steps of:

positioning a layer of sacrificial material over said first surface of said wafer after removal of said masking material; and subsequently etching said layer of sacrificial material so as to expose said wafer and said isolation regions wherein said steps of positioning a layer of sacrificial material and subsequently removing said layer results in any remaining oxide regions of said masking stack, occurring as a result of said step of forming said field isolation regions, being substantially removed from said first surface of said wafer.

9. The method of claim 2, further comprising the step of positioning a sacrificial passivation layer over said masking stacks and said isolation regions prior to selectively removing said upper surfaces of said masking stacks.

10. The method of claim 9, wherein said step of positioning said sacrificial passivation layer comprises forming a layer of silicon dioxide over said masking stacks and said isolation regions.

11. The method of claim 10, wherein said step of selectively removing said upper surface of said masking stacks comprises using chemical mechanical polishing to remove a portion of said sacrificial passivation layer and any oxide formed on said upper surface of said masking stack to expose said resulting remaining portion of said masking material.

12. The method of claim 11, further comprising the steps of:
    positioning a layer of sacrificial material over said first surface of said wafer after removing said masking material; and
    subsequently removing said layer of sacrificial material so as to expose said wafer and said isolation regions wherein said steps of positioning a layer of sacrificial material and subsequently removing said layer results in any remaining oxide regions of said masking stack, occurring as a result of said step of forming said field isolation regions, and said passivation layer being substantially removed from said first surface of said wafer.

13. The method of claim 12, wherein said step of positioning a sacrificial passivation layer on said first surface of said wafer comprises forming a sacrificial passivation layer having a thickness selected so that, upon removal of said layer of sacrificial material and said sacrificial passivation layer, said isolation regions are exposed and have a thickness substantially equal to said first thickness.

14. The method of claim 9, wherein said step of positioning a sacrificial passivation layer comprises positioning a layer of polysilicon over said masking stacks and said isolation regions.

15. The method of claim 14, further comprising the step of positioning a protective buffering material over said layer of polysilicon.

16. The method of claim 15, wherein the step of selectively removing an upper surface of said masking stack comprises:
    selectively removing any of said protective buffer material positioned over said upper surface of said masking stacks to expose only said polysilicon layer positioned on said upper surface of said masking stacks; and
    using chemical mechanical polishing (CMP) to remove said polysilicon layer positioned on said upper surface of said masking stacks and any oxide formed on said upper surface of said masking stacks so as to expose said masking material.

17. The method of claim 16, further comprising the steps of:
    growing a sacrificial oxide layer after said removal of said portion of said masking stack remaining after said selective removal step, wherein said step of growing said sacrificial oxide layer results in said polysilicon layer positioned on top of said field isolation regions transforming into silicon oxide; and
    removing said sacrificial oxide layer and said transformed polysilicon so that said wafer is exposed and said isolation regions are exposed, wherein said removing step results in said field isolation regions having a thickness substantially equal to said first thickness.

18. A method of producing a wafer having a plurality of isolation regions, said method comprising the steps of:
    positioning a masking material on a first surface of said wafer;
    selectively removing portions of said masking material to expose regions of said first surface of said wafer and to define a plurality of masking stacks having side walls and an upper surface;
    forming isolation regions in said exposed regions of said first surface of said wafer, wherein said isolation regions have a first thickness;
    removing the upper surface of said masking stacks through chemical mechanical polishing (CMP) to expose said resulting remaining portion of said masking material; and
    removing said resulting remaining portion of said masking material to expose said first surface of said wafer between said isolation regions.

19. The method of claim 18, further comprising the step of positioning a pad oxide layer on said first surface of said wafer prior to positioning a masking material on a first surface of said wafer.

20. The method of claim 19, wherein the step of positioning a masking material on a first surface of said wafer comprises positioning silicon nitride on said pad oxide layer.

21. The method of claim 20, wherein the step of forming isolation regions comprises growing silicon dioxide regions in said exposed regions of said wafer.

22. The method of claim 21, further comprising the steps of:
    positioning a layer of sacrificial material over said first surface of said wafer subsequent to said removal of said masking material; and
    subsequently etching said layer of sacrificial material so as to expose said wafer and said isolation regions wherein said steps of positioning a layer of sacrificial material and subsequently removing said layer results in any remaining oxide regions of said masking stack, occurring as a result of said step of forming said isolation regions, being substantially removed from said first surface of said wafer.

23. The method of claim 18, further comprising the step of positioning a sacrificial passivation layer on said masking stacks and said isolation regions prior to selectively removing said upper surfaces of said masking stacks.

24. The method of claim 23, wherein said step of positioning said sacrificial passivation layer material comprises forming a layer of silicon dioxide over said masking stacks and said isolation regions.

25. The method of claim 24, wherein said step of selectively removing said upper surface of said masking stacks comprises using chemical mechanical polishing (CMP) to remove the portion of said sacrificial passivation layer positioned on said upper surface of said masking stack and any oxide formed on said upper surface of said masking stack to expose said masking material.

26. The method of claim 25, further comprising the steps of:
    positioning a layer of sacrificial material over said first surface of said wafer after removing said masking material; and
    subsequently removing said layer of sacrificial material so as to expose said wafer and said isolation regions wherein said steps of positioning said layer of sacrificial material and subsequently removing said layer results in any remaining oxide regions of said masking stack, occurring as a result of said step of forming said isolation regions, and said passivation layer being substantially removed from said first surface of said wafer.

27. The method of claim 26, wherein said step of forming a sacrificial passivation layer on said first surface of said wafer comprises forming a sacrificial passivation layer having a thickness selected so that, upon removal of said layer of sacrificial material and said sacrificial passivation layer, said isolation regions are exposed and have a thickness substantially equal to said first thickness.

28. A method of producing a wafer having a plurality of isolation regions, said method comprising the steps of:

positioning a masking material of a first type of material on a first surface of said wafer;

selectively removing portions of said masking material to expose regions of said first surface of said wafer and to define a plurality of masking stacks having side walls and an upper surface;

forming isolation regions in said exposed regions of said first surface of said wafer, wherein said isolation regions have a first thickness;

positioning an oxidizable sacrificial passivation layer of a second type of material over said isolation regions;

selectively removing only an upper portion of said masking stacks without reducing said first thickness of said isolation regions; and removing said masking material remaining after said selectively removing step wherein said first type of masking material and said second type of passivation material are selected so that said sacrificial passivation layer remains over said isolation regions following said step of removing said masking material.

29. The method of claim 28, further comprising the steps of removing said sacrificial passivation layer after removing said masking stacks so as to expose said surface of said wafer and said isolation regions, wherein said step of removing said sacrificial passivation layer results in any remaining oxide material on said first surface of said wafer, occurring as a result of said step of forming said field isolation regions, being removed and wherein said thickness of said field isolation regions is substantially equal to said first thickness after said step of removing said sacrificial passivation layer.

30. The method of claim 29, wherein said step of positioning said sacrificial passivation layer comprises positioning a layer of polysilicon over said masking stacks and said isolation regions.

31. The method of claim 30, further comprising the step of positioning a protective buffering material over said layer of polysilicon.

32. The method of claim 31, wherein the step of selectively removing an upper portion of said masking stack comprises:

selectively etching said buffer material to expose only said upper surface of said masking stacks; and using chemical mechanical polishing (CMP) to remove said polysilicon layer positioned on said upper surface of said masking stack and any oxide formed on said upper surface of said masking stack to expose said masking material.

33. The method of claim 32, wherein the step of depositing said buffer material over said sacrificial passivation layer comprises depositing a photoresist material over said sacrificial passivation layer.

34. The method of claim 32, further comprising the step of removing said buffer material remaining on the portions of said sacrificial passivation layer positioned over said isolation regions after said masking material has been removed.

35. The method of claim 34, further comprising the steps of:

growing a sacrificial oxide layer after removal of said portion of said masking stack remaining after said selective exposing step, wherein said step of growing said sacrificial oxide layer results in said polysilicon layer positioned on top of said field isolation regions transforming into silicon dioxide; and removing said sacrificial oxide layer and said oxidized polysilicon so that both said first surface of said wafer and said isolation regions are exposed, wherein said field isolation region has a thickness substantially equal to said first thickness after said removing step.

36. The method of claim 28, wherein said step of positioning said sacrificial passivation layer comprises forming a sacrificial passivation layer of silicon dioxide over said masking stacks and said isolation regions.

37. The method of claim 36, wherein said step of selectively exposing only said portion of said upper surface of said masking stacks comprises using chemical mechanical polishing (CMP) to remove said portion of said passivation layer and any oxide formed on said upper surface of said masking stack to expose said masking material.

38. The method of claim 37, further comprising the steps of:

positioning a layer of sacrificial material over said first surface of said wafer after removing said masking material; and subsequently removing said layer of sacrificial material so as to expose said first surface of said wafer and said isolation regions wherein said steps of positioning a layer of sacrificial material and subsequently removing said layer results in any remaining oxide regions of said masking stack, occurring as a result of said step of forming said field isolation regions, and said sacrificial passivation layer being substantially removed from said first surface of said wafer.

39. The method of claim 38, wherein said step of forming a sacrificial passivation layer on said first surface of said wafer comprises forming a sacrificial passivation layer having a thickness selected so that, upon removal of said layer of sacrificial material and said sacrificial passivation layer, said isolation regions are exposed and have a thickness substantially equal to said first thickness.

40. A method of producing a wafer having a plurality of isolation regions, said method comprising the steps of:

positioning a masking material on a first surface of said wafer;

selectively removing portions of said masking material to expose regions of said first surface of said wafer and to define a plurality of masking stacks having side walls and an upper surface;

growing isolation regions in said exposed regions of said first surface of said wafers, wherein said isolation regions are grown to their final thicknesses; and selectively removing only an upper surface of said masking stacks without reducing said final thickness of said isolation regions by using chemical mechanical polishing (CMP) to remove said upper surface of said masking stacks.

41. The method of claim 40, further comprising the step of removing the portion of said masking stacks remaining after said selectively removing step to expose said first surface of said wafer without reducing said final thickness of said isolation regions.

42. The method of claim 40, further comprising the step of positioning a sacrificial passivation layer over said masking stacks and said isolation regions prior to selectively removing said upper surfaces of said masking stacks.

43. The method of claim 41, wherein said step of using chemical mechanical polishing comprises removing said portion of said sacrificial passivation layer and any oxide formed on said upper surface of said masking stack during said step of growing said isolation regions to expose said masking material.

44. A method of producing a wafer having a plurality of isolation regions, said method comprising the steps of:

positioning a masking material of a first type of material on a first surface of said wafer;

selectively removing portions of said masking material to expose regions of said first surface of said wafer and to define a plurality of masking stacks having side walls and an upper surface;

forming isolation regions in said exposed regions of said first surface of said wafer, wherein said isolation regions have a first thickness;

positioning an oxidizable sacrificial passivation layer of a second type of material over said isolation regions;

selectively removing only an upper portion of said masking stacks without reducing said first thickness of said isolation regions;

removing said masking material remaining after said selectively removing step wherein said first type of masking material and said second type of passivation material are selected so that said sacrificial passivation layer remains over said isolation regions following said step of removing said masking material;

performing an oxidation step to transform said material of said second type into an sacrificial oxide layer; and removing said sacrificial oxide layer so that said isolation regions are exposed, wherein said isolation regions have a thickness substantially equal to said first thickness after said removing step.

* * * * *